US012727132B2

(12) United States Patent
Casey et al.

(10) Patent No.: US 12,727,132 B2
(45) Date of Patent: Sep. 1, 2026

(54) HIGH FAULT-CURRENT INVERTERS

(71) Applicant: X Development LLC, Mountain View, CA (US)

(72) Inventors: Leo Francis Casey, San Francisco, CA (US); Raymond Daly, Palo Alto, CA (US)

(73) Assignee: X Development LLC, Mountain View, CA (US)

( * ) Notice: Subject to any disclaimer, the term of this patent is extended or adjusted under 35 U.S.C. 154(b) by 380 days.

(21) Appl. No.: 18/334,713

(22) Filed: Jun. 14, 2023

(65) Prior Publication Data

US 2024/0421700 A1 Dec. 19, 2024

(51) Int. Cl.

*H05K 7/20* (2006.01)
*H02M 1/32* (2007.01)
*H02M 7/53862* (2007.01)

(52) U.S. Cl.

CPC ........ *H05K 7/20945* (2013.01); *H02M 1/325* (2021.05); *H02M 7/53862* (2013.01); *H05K 7/20127* (2013.01)

(58) Field of Classification Search

CPC .......... H05K 7/20945; H05K 7/20127; H02M 1/325; H02M 7/53862; H02M 1/32; H02M 7/003; H02M 7/5387; H02M 1/327

See application file for complete search history.

(56) References Cited

U.S. PATENT DOCUMENTS

| | | | | |
|---|---|---|---|---|
| 6,335,872 | B1 * | 1/2002 | Zhou | H02M 5/14 363/148 |
| 9,667,170 | B2 | 5/2017 | Vasquez et al. | |
| 10,072,877 | B2 | 9/2018 | Toporis et al. | |
| 2010/0147492 | A1 * | 6/2010 | Conry | H01L 23/427 165/104.31 |
| 2017/0089664 | A1 * | 3/2017 | Kras | F41B 11/73 |
| 2019/0166717 | A1 * | 5/2019 | Gass | F25B 9/06 |
| 2023/0208139 | A1 * | 6/2023 | Holveck | H02J 3/14 700/295 |
| 2024/0175397 | A1 * | 5/2024 | Tunzini | F02C 7/268 |
| 2024/0223088 | A1 * | 7/2024 | Xu | H02M 3/33507 |

FOREIGN PATENT DOCUMENTS

| | | | | |
|---|---|---|---|---|
| GB | 2590541 A | * | 6/2021 | H05B 45/39 |

* cited by examiner

*Primary Examiner* — Charles Cai

(74) *Attorney, Agent, or Firm* — Fish & Richardson P.C.

(57) ABSTRACT

This disclosure describes a system and method for enabling an inverter to temporarily sustain fault current. One implementation is a system that includes an inverter having a plurality of transistors. A reservoir having an outlet channel is configured to contain a compressed gas. The outlet channel is arranged to direct the compressed gas towards a heatsink in thermal communication with one or more of the plurality of transistors. A control valve can be positioned between the reservoir and the outlet channel and a controller can be configured to detect an overcurrent event in the inverter and, in response, open the control valve. A transformer is electrically connected to an output of the inverter and configured to step down voltage from the inverter to a circuit being supplied by the inverter.

18 Claims, 5 Drawing Sheets

HIGH FAULT-CURRENT INVERTERS

This disclosure generally relates to electrical inverters.

BACKGROUND

Conventional inverters are fast responding, solid state devices, which can rapidly adapt their output current and voltage based on downstream demand. In many renewable applications, DC electricity is generated, and must be converted to AC for transmission or to supply many common loads. Inverters convert the generated DC into AC, simulating conventional AC generators (e.g., a synchronous generator). Many electrical grids contain protective devices that are configured to put the grid in a safe condition in the event of a high current (e.g., produced by a fault). Examples of such protective devices include circuit breakers and fuses. These devices often do not "trip" unless they receive very large currents (e.g., 2-7 per unit fault current). A modern inverter supplying a grid that includes conventional protective devices will often shut down at a much lower current than the protective devices (e.g., 1.0-1.2 per unit fault current). Thus, if a fault occurs in a grid supplied by an inverter, the inverter will likely shut down prior to any protective devices tripping, causing the entire grid to lose power, and preventing localization of the fault.

SUMMARY

In general, the disclosure involves a system, and method for enabling an inverter to temporarily sustain fault current. One implementation is a system that includes an inverter having a plurality of transistors. A reservoir having an outlet channel is configured to contain a compressed gas. The outlet channel is arranged to direct the compressed gas towards a heatsink in thermal communication with one or more of the plurality of transistors. A control valve can be positioned between the reservoir and the outlet channel and a controller can be configured to detect an overcurrent event in the inverter and, in response, open the control valve.

Implementations can optionally include one or more of the following features.

In some instances, the compressed gas is at least one of air, carbon dioxide, nitrogen, or argon.

In some instances, opening the control valve provides cooling to the heatsink by a throttling component arranged within the outlet channel and configured to reduce a temperature of the compressed gas as the gas flows through the throttling component.

In some instances, the system includes a pump arranged to recharge the reservoir.

In some instances, the outlet channel is embedded within the heatsink.

In some instances, a transformer is electrically connected to an output of the inverter and configured to step down voltage from the inverter to a circuit being supplied by the inverter. A switch can be connected in series between the output of the inverter, the switch includes a first state and a second state. When the switch is in the first state the transformer does not conduct current from the inverter, and when the switch is in the second state the transformer conducts current between the inverter and the circuit. A second controller can be configured to detect an overcurrent event in the inverter and actuate the switch. In some instances, the transformer is an autotransformer.

A second implementations is a system that includes an inverter having a plurality of transistors, the inverter configured to supply a circuit with AC power. The system includes a transformer that is configured to, when connected, step down voltage from the inverter to the circuit. A switch that has a first state and a second state is included in the system. When the switch is in the first state the transformer does not conduct current from the inverter and when the switch is in the second state the transformer conducts current between the inverter and the circuit. A first controller can be configured to detect an overcurrent event in the inverter and actuate the switch.

In some instances, the transformer is an autotransformer.

In some instances, the switch is a silicon carbide metal oxide semiconductor field-effect transistor.

In some instances, the system further includes a reservoir configured to contain a compressed gas. The reservoir includes an outlet channel arranged to direct the compressed gas towards a heatsink in thermal communication with one or more of the plurality of transistors. A control valve can be positioned between the reservoir and the outlet channel and a second controller can be configured to detect an overcurrent event in the inverter and, in response open the control valve. In some instances, the compressed gas is at least one of air, carbon dioxide, nitrogen, or argon. In some instances, opening the control valve provides cooling to the heatsink by a throttling component arranged within the outlet channel and configured to reduce a temperature of the compressed gas as the gas flows through the throttling component.

In some instances, the heatsink is configured to perform passive cooling during normal operations, and includes the outlet channel embedded within the heatsink.

The details of one or more implementations of the subject matter of this specification are set forth in the accompanying drawings and the description below. Other features, aspects, and advantages of the subject matter will become apparent from the description, the drawings, and the claims.

DESCRIPTION OF DRAWINGS

This disclosure relates to an electrical inverter that produces a high current for a relatively long duration when a downstream electrical fault occurs.

DETAILED DESCRIPTION

Figure 1:
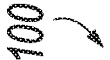
FIG. 1 is a diagram of an example power supply system with a high fault-current inverter.
Figure 1:
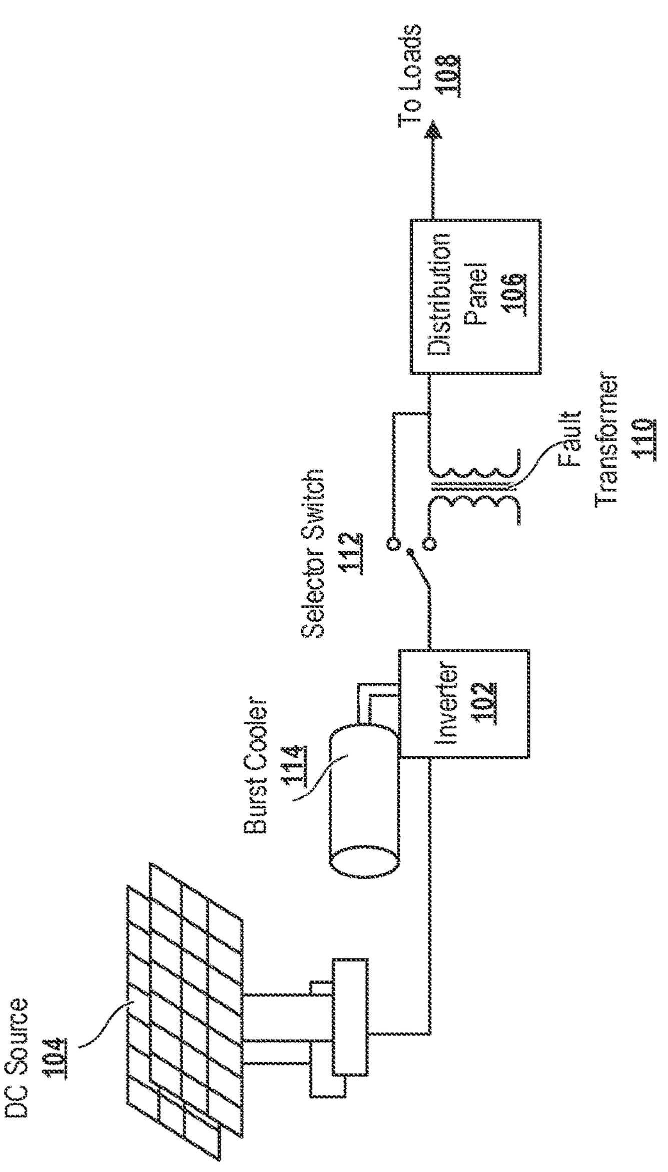

This disclosure describes a system and method for an electrical inverter that produces a high current for a relatively long duration when a downstream electrical fault occurs. This disclosure describes systems to provide the advantage of making inverters "backwards-compatible" or able to sustain a large fault current for a brief period of time, in order to allow conventional, protective devices to isolate a fault condition before the inverter shuts down. By allowing an inverter to temporarily provide large fault currents to the grid it supplies, conventional protective devices will trigger and isolate the fault, then the inverter can resume normal operation. This is advantageous in that it localizes the fault, and ensures continuity of power to unaffected circuits within the grid that are supplied by the inverter. The disclosure presents two techniques for enabling the inverter to supply fault current to the grid: (1) an active "burst" cooling system which can rapidly mitigate thermal damage associated with overcurrent in the inverter, and (2) a downstream transformer which can reduce inverter current by stepping up voltage, while providing the fault current to the grid.

Thermal damage is a primary limitation in the amount of output current an inverter can supply. The transistors (e.g., insulated-gate bipolar transistor or IGBT) are configured in a bridge and perform switching to generate an AC output from a DC input. If these transistors in the inverter can be sufficiently cooled during an overcurrent event, then permanent damage will not occur and the inverter can be permitted to operate for longer periods at high current. In order to provide rapid cooling to the inverter transistors, a compressed gas system is used. When cooling is needed, the compressed gas (e.g., air, CO2, or other gas) stored in a reservoir is allowed to rapidly expand, causing a rapid decrease in temperature. The cooled gas can then pass over, through, or adjacent to the transistors in order to absorb heat generated by the transistors. In some implementations, the compressed gas is allowed to expand, and pass through heat transfer tubes embedded into one or more heatsinks that are thermally coupled to the transistors of the inverter. In some implementations, the gas passes directly through channels within the one or more heatsinks. In some implementations, a nozzle or opening directs the cooled gas to pass over/across the heatsinks. This configuration can be advantageous in that only a single moving part (e.g., a valve) is required to initiate temporary cooling. When the overcurrent event is complete, the reservoir can be recharged, re-arming the system for future burst cooling.

Another technique to allow an inverter to supply high current during a fault event is to place a transformer downstream of the inverter in the event of a fault, in order to reduce the voltage drop seen at the output of the inverter due to the fault. In some implementations, the transformer can be activated, or energized when an overcurrent condition is detected by the inverter, and can allow the inverter to drive its output voltage back toward a nominal output voltage, while maintaining the low voltage, high current condition in the grid. In some implementations, the transformer is switched serially into the grid upon detection of the fault condition using transistors (e.g., using silicon controlled rectifiers (SCR's) or IGBTs, or other suitable switching mechanisms.)

In some instances, both of the foregoing techniques can be used simultaneously. That is, both burst cooling, and a voltage boosting transformer can be applied in order to allow the inverter to temporarily output a fault current similar to that of conventional power supplies (e.g., a synchronous generator).

FIG. 1 illustrates an example power supply system 100 with a high fault-current inverter. The system 100 includes a DC source 104, an inverter 102, and a distribution panel 106 supplying various loads 108. In order to enable the inverter 102 to supply higher currents for a longer duration during a fault condition, the system 100 can include a fault transformer 110, a burst cooling system 114, or both.

DC source 104 can be solar panels, batteries, a DC generator, or other electrical supply that provides direct current electricity. In some implementations, DC source 104 is composed of multiple energy sources supplying DC power to the inverter 102. Inverter 102 can be a solid state device that is configured to convert DC electrical power to AC electrical power. Conventional inverters use a series of timed electronic switches such as field effect transistors (FETs) or insulated gate bipolar transistors (IGBTs) to convert the DC power to AC. A limiting factor in the amount of current the inverter 102 can supply is thermal energy build up caused by the switching of the FETs or IGBTs in the inverter. High temperatures can cause breakdown of electrical components and failure of the inverter 102.

The distribution panel 106 receives AC power from the inverter, and in some implementations, additional sources (e.g., grid power, or an AC generator), and provides it to loads 108 via multiple circuits. In some implementations, each circuit includes an individual circuit breaker, and an overall master breaker in the distribution panel 106 are configured to interrupt power if a certain current is exceeded. For example a residential distribution panel might include a master breaker that trips at 200A (at 120V or 240V AC) and a couple dozen individual circuits, each with its own breaker that trips between 10 A and 60 A. In a conventional power system (e.g., where the distribution panel 106 is supplied from a large utility grid) a fault condition in one circuit could cause extremely large current flow until its associated breaker trips. For example, a short-circuited kitchen appliance may cause hundreds of amps AC to flow for a few milliseconds until the associated breaker (e.g., kitchen outlet breaker) trips. When that breaker trips, the faulty circuit is isolated, and the remaining circuits can continue to provide electrical power. If for some reason the kitchen outlet breaker fails to trip, the main breaker, which typically has a slower response time than the individual circuit breakers, will trip, preventing major damage, but not isolating the fault to a specific circuit. This "graceful" failure set-up is possible because the electrical grid can supply a comparatively large current (e.g., significantly more than the 200A main breaker is designed to withstand).

In system 100 however, the distribution panel 106 is supplied by inverter 102. Conventional inverters are unable to supply the large fault current necessary to trip conventional breakers. Instead a conventional inverter will often detect the over-current situation and immediately shutdown, often with a response time that is faster than a conventional breaker. This prevents damage to the inverter and reduces risk of damage to downstream circuits, but does not allow the conventional protective devices to isolate the fault. Therefore, re-energizing the inverter will re-initiate the fault. Inverter 102 is configured to temporarily provide high fault current, in order to allow time for conventional protective devices (e.g., breakers and fuses) to trip, restoring the "graceful" failure modes that already exist in many electrical distribution systems.

One technique for allowing the inverter to continue operation in faulted conditions is to use a fault transformer 110. Often faulted circuits supply relatively low power. They are in a high current, but low voltage condition. When a fault occurs, the voltage across the faulted circuit often drops significantly as current increases. The inverter 102 can detect an over-current condition. IGBTs (or other switching devices) within the inverter can include multiple sensor elements, and can detect, for example, over-voltage across a particular IGBT, indicating desaturation, or over-current being supplied by the inverter 102. Upon detecting an over-current, or overdraw condition, the inverter 102, or an associated control mechanism, can activate selector switch 112, which causes the inverter 102 to supply the distribution panel 106 through the fault transformer 110 instead of directly.

Selector switch 112 can be any suitable switching device, such as a group of one or more bipolar junction transistors (BJTs), silicon carbide (SiC) Metal Oxide Semiconductor Field-Effect Transistors (MOSFETs), gallium oxide devices, insulated-gate bipolar transistors (IGBTs), Thyristors, or other switch suitable for switching the power of the inverter between directly supplying distribution panel 106 and supplying the fault transformer 110. In some implementations, the fault transformer 110 is an autotransformer. An autotransformer can be advantageous because it can be made smaller, lighter, and less expensive for a given power rating. Autotransformers can also have higher efficiency than conventional dual-winding transformers. Regardless of type, a primary side of the transformer can be configured to be supplied by the inverter 102 at a first voltage, and step down that voltage to the secondary side, permitting increased current flow at the secondary side. This allows the inverter 102 to continue operating at a closer to nominal voltage, and supply lower current, while the distribution panel 106 receives a lower voltage, but higher current. If the current supplied from the fault transformer 110 is sufficient, the faulted circuit will trip a conventional protective device (e.g., circuit breaker or fuse) and then voltage within the system will return to normal. Upon detecting the rise in voltage (and associated reduction in current), the inverter 102 can toggle the selector switch 112 back to a direct supply position, effectively electrically disconnecting fault transformer 110 from the system.

A second technique for allowing the inverter 102 to continue operation in a faulted condition is to provide temporary cooling to components of the inverter 102. A burst cooler 114 (discussed in more detail below with respect to FIG. 2) can be provided to allow the inverter 102 to exceed its normal rated capacity for a brief period of time in a fault condition. This can be sufficient to allow the downstream protective device (e.g., breakers in distribution panel 106) to activate, isolating the fault.

The use of fault transformer 110 and burst cooler 114 are independent in that either one or both can be used to increase the current output capacity of the inverter 102. In some implementations, only a single option is used. For example, system 100 may not include a fault transfer 110, or may not include a burst cooler 114, depending on the application. In some implementations, both the burst cooler 114 and the fault transformer 110 are used simultaneously upon initial detection of a fault condition. In some implementations, and as described in example process 300 below with respect to FIG. 3, the fault transformer 110 and the burst cooler 114 are used sequentially. That is, one technique is applied, and if the fault has not cleared or the downstream protective devices have not yet tripped, the other technique can be applied to increase the likelihood of the inverter 102 successfully allowing a protective device to trip.

Figure 2:
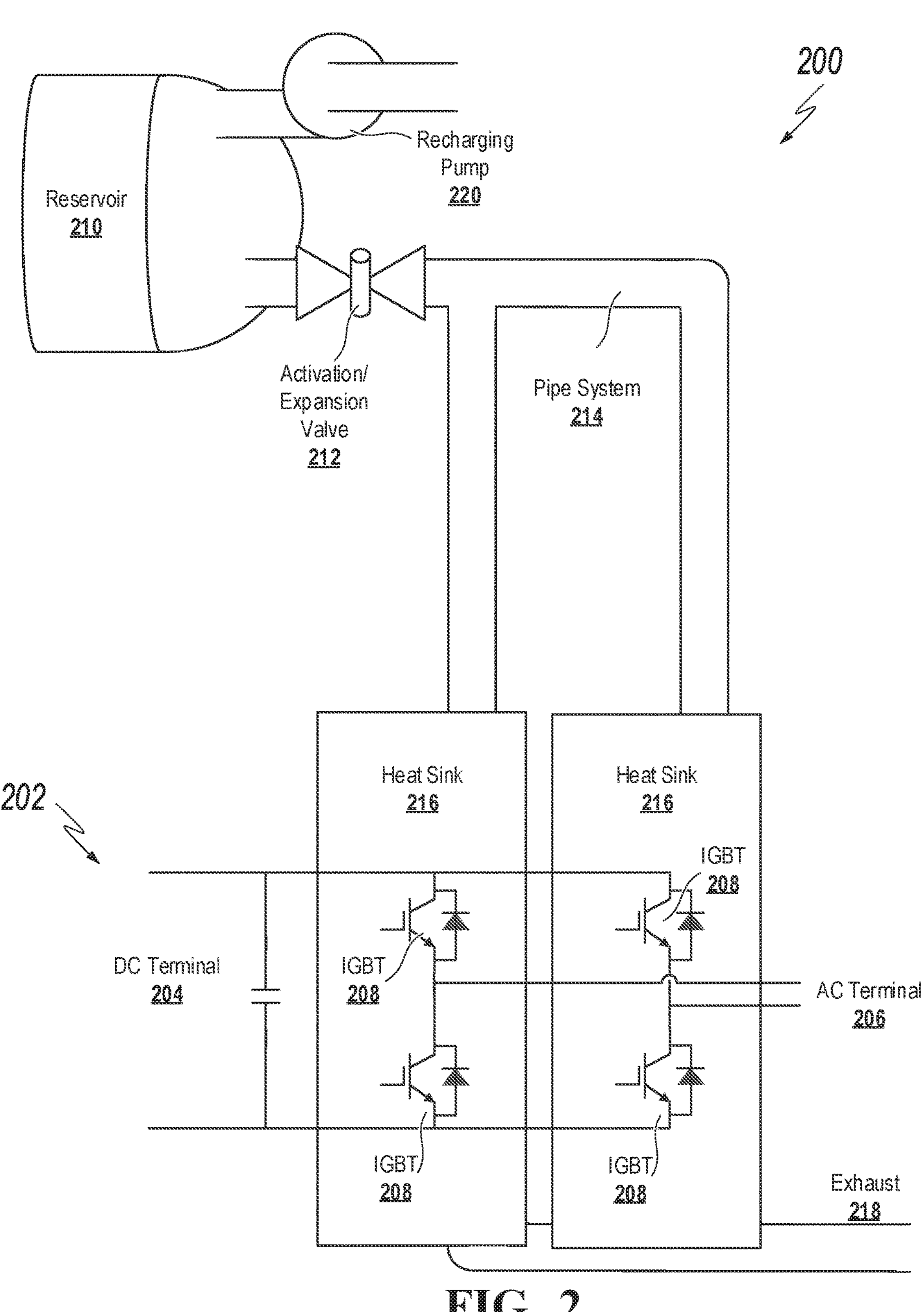
FIG. 2 is a diagram of a burst cooling system for use in a high fault-current inverter system.

FIG. 2 illustrates a burst cooling system for use in a high fault-current inverter system. The illustrated burst cooling system 200 is an example system that could be used, for example, as burst cooling system 114 as described above with respect to FIG. 1. The burst cooling system 200 is integrated with an inverter 202, which can be a full bridge type inverter. In the illustrated example, the inverter 202 includes four IGBTs 208 in an H-bridge configuration. A DC terminal 204 receives DC electrical power and the AC terminal 206 transmits AC electrical power from inverter 202.

While inverter 202 is illustrated as including 4 IGBTs, other inverter configurations are possible, such as an inverter that utilizes metal oxide semiconductor field effect transistors (MOSFETs). In some implementations, the inverter 202 is arranged in a different configuration with more transistors, such as a multi-level layout which may have 12 or more transistors (IGBTs or FETs). Each transistor of the inverter 202 can be in thermal communication with one or more heatsinks 216.

The cooling system 200 includes a reservoir which contains a compressed gas such as nitrogen, air, carbon dioxide, argon, or other gas. Upon the need to apply burst cooling to the inverter 202, the activation/expansion valve 212 can be opened, allowing high pressure (high density) gas from the reservoir 210 to expand into a pipe system 213, flow through heatsinks 216 and exit the system via exhaust 218. The activation/expansion valve 212 can be configured to throttle flow between the reservoir 210 and the pipe system 214. The reservoir 210 is normally at a higher pressure than pipe system 214 which causes flow. The gas expanding through the activation/expansion valve will drop in temperature based on the Joule-Thomson effect, as it moves from a high density state in the reservoir 210 to a relatively lower density state in the pipe system 214.

In some implementations, activation/expansion valve 212 is an electronically controlled throttle valve, which can be computer adjusted, for example, based on a sensed temperature at the IGBTs 208. In these implementations, the activation/expansion valve 212 can be configured to allow more expansion, and thus more cooling, if temperatures are too high, and reduce expansion, and prolong the availability of burst cooling if temperatures are able to be controlled. In some implementations the activation/expansion valve 212 is motor operated, or servo operated, and can be adjusted. In some implementations, activation/expansion valve 212 is solenoid operated, and is binary, either substantially opened or closed. In some implementations, valve 212 is an isolation valve and is fully open when activated. In such implementation, a separate throttling device can be included in the gas flow path, e.g., pipe system 214, between the reservoir 210 and the heat sink(s) 216. The throttling device can be, e.g., a throttling valve, an orifice, a thermal expansion valve, or other suitable device.

In some implementations, the activation/expansion valve 212 is mechanically operated. For example, a diagraph connected to a sensing line that is in thermal communication with the IGBTs 208 can be configured to flex if the IGBT temperature gets too high. The flexing diaphragm can open the activation/expansion valve 212 and initiate burst cooling.

The cooled gas can flow through heatsink(s) 216 removing heat waste generated by switching of the IGBTs 208, and allowing the IGBTs 208 to operate at higher frequencies/currents. The pipe system 214 can exhaust out of system 200. In some implementations, exhaust 218 simply vents to the ambient atmosphere. In some implementations, exhaust 218 supplies a capture system, which recollects the expanded gas for recompression, cooling, and re-use.

In some implementations, a recharging system, including a recharging pump 220 is provided. For example, where the system operates with air as a gas, a recharging pump 220 can re-pressurize the reservoir 210 following depletion or completion of a burst cooling cycle. Additional systems, such as a filter, dehydrator, intercooler, or other components, while not illustrated, are also possible in the disclosed system.

Figure 3:
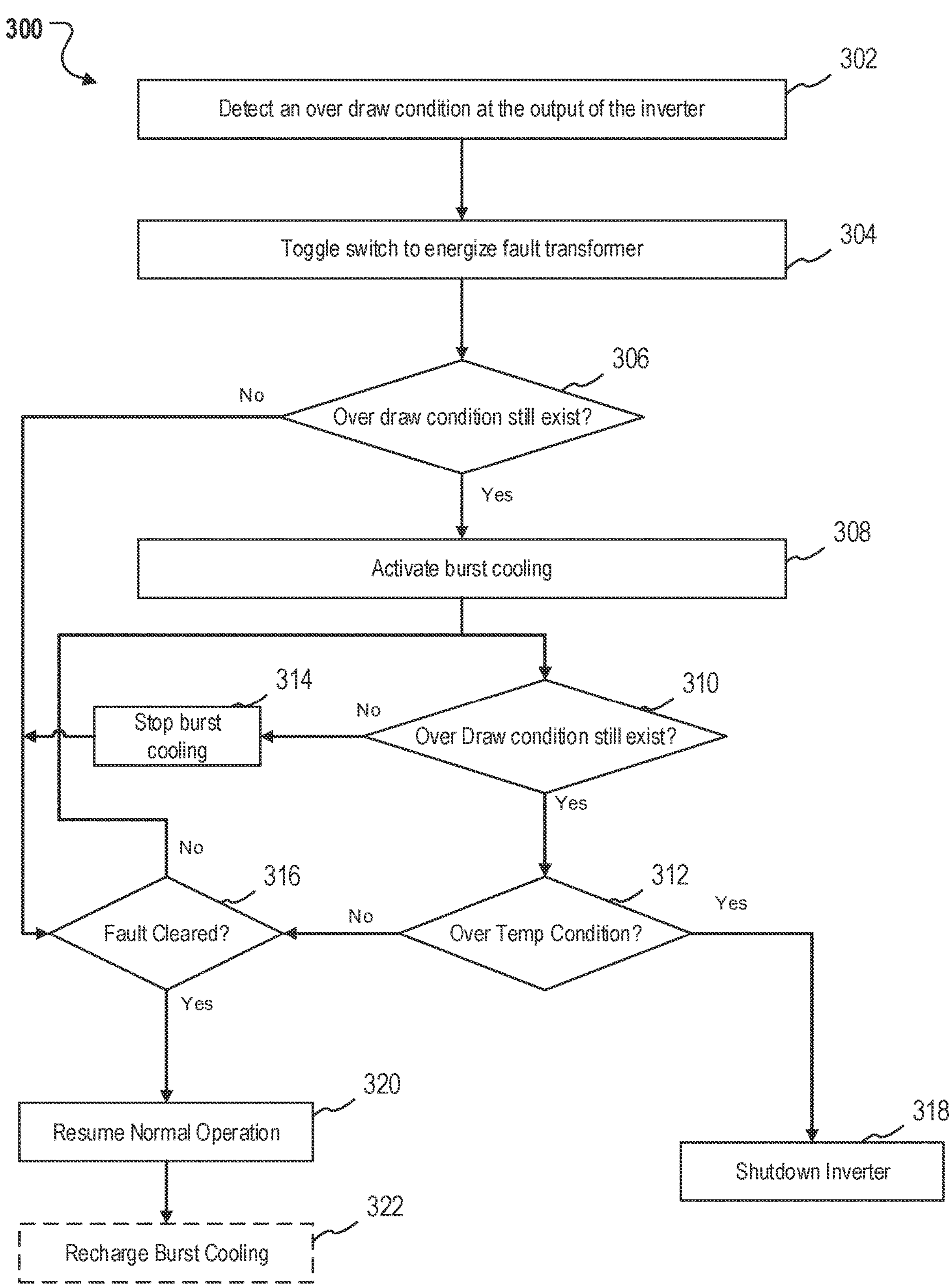
FIG. 3 is a flowchart illustrating an example process for maintaining an inverter operational while supplying high current.

FIG. 3 is a flowchart illustrating an example process 300 for maintaining an inverter operational while supplying high current. It will be understood that process 300 may be performed, for example, by any suitable system, environment, software, and hardware, or a combination of systems, environments, software, and hardware as appropriate. In some instances, process 300 can be performed by the system 100, or portions thereof, described in FIG. 1, as well as other components or functionality described in other portions of this description. In other instances, process 300 may be performed by a plurality of connected components or systems. Any suitable system(s), architecture(s), or application (s) can be used to perform the illustrated operations.

At 302, an overdraw condition is detected at the output of the inverter. Overdraw can refer to over current, over power, over (or under) voltage, etc. In other words, the overdraw condition detected represents a high likelihood that there is a faulted circuit downstream of the inverter, and the inverter will need to supply additional current for a brief period of time to allow protective devices to isolate the fault. The overdraw condition can be detected based on the output of the inverter, or a downstream sensor (e.g., a voltage sensor or current sensor at a distribution panel). For example, the inverter can include a per phase current sensing at its output using toroidal sensing and hall effect of a Rogowski coil. In another example, the overdraw can be detected based on sensed switching voltage within the inverter. At 304, in order to allow the inverter to continue operation, a switch is toggled to energize a fault transformer. The fault transformer will step down voltage between the inverter and the distribution panel, increasing current flow, and maintaining voltage at the output of the inverter higher than otherwise would occur when the inverter directly supplies the distribution panel. In some implementations, the fault transformer is an autotransformer.

At 306, it is determined whether the overdraw condition still exists. In some circumstances, with the fault transformer energized, the inverter will be able to supply sufficient current to trip conventional protective devices such as circuit breakers, which will isolate the fault. If the overdraw condition does not still exist, process 300 can proceed to 316 and the status of the fault can be monitored. If the fault still exists but the fault transformer has removed the overdraw condition, the inverter can continue to supply low voltage, high current power to the distribution panel.

At 308, if the overdraw condition still exists with the fault transformer energized, then burst cooling is activated 308. The burst cooling system can enable the inverter to continue to supply power during the overdraw condition. At 310 the output of the inverter is monitored while burst cooling is applied, if the overdraw condition has cleared, at 314, burst cooling can be ceased, and process 300 can again proceed to 316 to monitor the status of the fault. If the fault has not cleared, process 300 can return to 310 for continued monitoring of the overdraw condition. If the overdraw condition still exists at 310, process 300 proceeds to 312 where the inverter is monitored for an over-temperature condition. In some implementations, the burst cooling is controllable (e.g., an expansion valve can be throttled to adjust the amount of cooling applied). The burst cooling can be controlled to maintain a predetermined operating temperature within the inverter, or at the transistors of the inverter. If the burst cooling system is unable to maintain the inverter temperature within the operating temperature, or if the inverter temperature exceeds a shutdown temperature, the inverter can be shut down at 318.

Inverter shutdown at 318 can be to protect the inverter from permanent damage, and can essentially de-energize any downstream component from the inverter that does not have a separate power supply.

Otherwise, while no over temperature condition exists, process 300 can again proceed to 316 and monitor for the fault to be cleared (e.g., a circuit breaker opening, or a faulted piece of equipment being de-energized). When the fault clears, at 320, normal operation can be resumed. The burst cooling can be disabled if currently active, and the fault transformer can be toggled out of the circuit, such that the inverter directly supplies the distribution panel once more.

Optionally, at 322, if the burst cooling system was used, it can be recharged. In some implementations, the burst cooling system recaptures and recompresses expanded gas back into a reservoir for future use. In some implementations, for example where the gas used is air, a compressor recharges the reservoir using ambient atmosphere. In some implementations, the reservoir includes one or more disposable or replaceable cartridges (e.g., carbon dioxide canisters) that can be readily replaced by a user, and either disposed of or remotely recharged.

Figure 4:
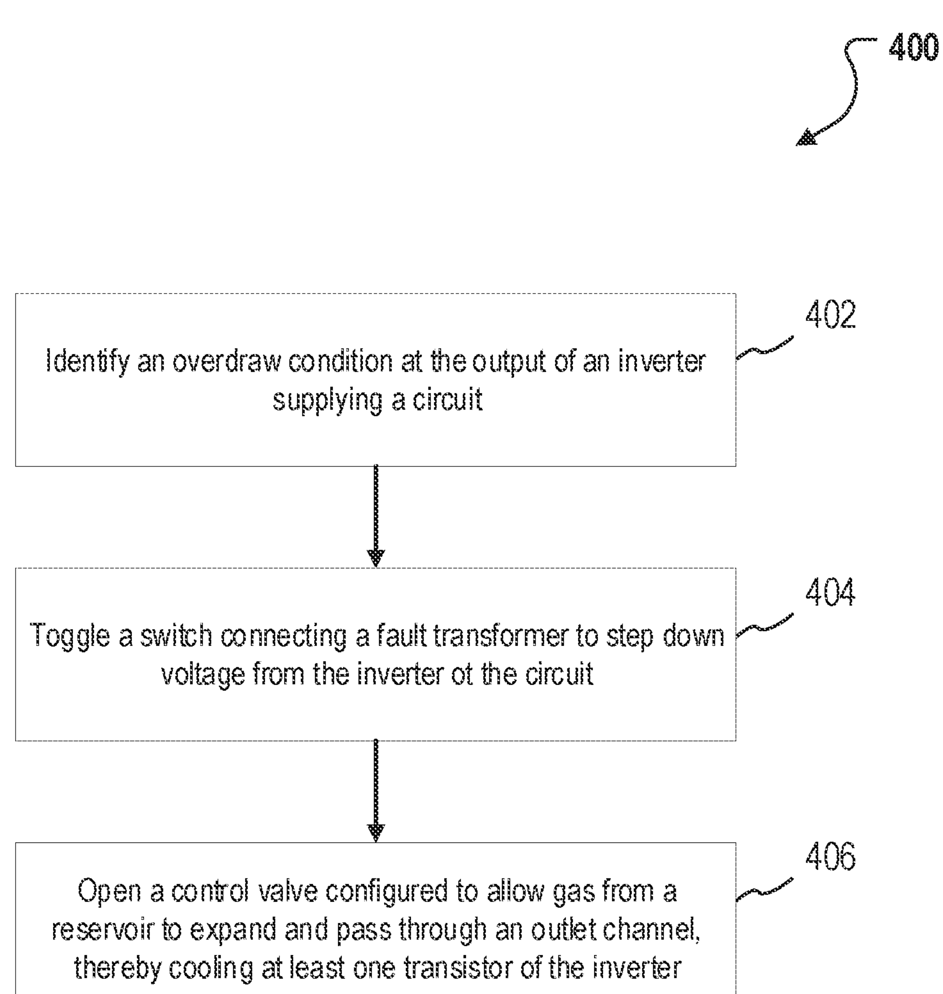
FIG. 4 is a flowchart illustrating an example process for operating an inverter above normal current output.

FIG. 4 is a flowchart illustrating an example process 400 for operating an inverter above normal current output. It will be understood that process 400 may be performed, for example, by any suitable system, environment, software, and hardware, or a combination of systems, environments, software, and hardware as appropriate. In some instances, process 400 can be performed by the system 100, or portions thereof, described in FIG. 1, as well as other components or functionality described in other portions of this description. In other instances, process 400 may be performed by a plurality of connected components or systems. Any suitable system(s), architecture(s), or application(s) can be used to perform the illustrated operations.

At 402, an overdraw condition is identified at the output of an inverter that is supplying power to a circuit. The overdraw condition can be, for example, an over-current condition caused by a sudden drop in circuit impedance due to a fault. For example, a faulted machine could be connected to the circuit, or an insulation failure could cause a ground fault, resulting in a relatively low voltage impedance, thus low voltage, high current overdraw condition. In some implementations, the overdraw condition is detected by sensors within the inverter, such as voltage sensors measuring voltages across the transistor. In some implementations, the overdraw condition is detected by a separate sensor (e.g., a hall sensor, fluxgate sensor, or current shunt) measuring current at the output of the inverter. The circuit can be any suitable circuit, for example, the circuit can include a distribution panel with a number of circuits such as a household power distribution panel. The circuit receives AC power from the inverter, and distributes it to various loads. The circuit can include one or more protective devices such as fuses, circuit breakers, varistors, inrush current limiters, or other devices.

At 404, a switch is toggled that connects a fault transformer in series between the inverter and the circuit. In some implementations, the fault transformer is an autotransformer, and is configured to step down voltage from the inverter to the circuit. In this manner, voltage at the output of the inverter is maintained higher than it otherwise would be. Thus for a given power level, current is increased. This can allow the inverter to supply enough current to trip one or more protective devices in the circuit.

At 406, if the inverter is in a continued overdraw condition, a control valve is opened that allows a gas to expand from a reservoir through an outlet channel configured to cool at least one transistor of the inverter. In some implementations, the outlet channel is insulated until it is embedded in one or more heatsinks that are in thermal contact with the transistor(s). In some implementations, the control valve is throttle-able. A controller, or other computing system, can adjust flow rate (and thus cooling) through the control valve based on a temperature sensed within the inverter. The gas expanding through the control valve can cool via the Joule-Thomson effect, and can be configured to apply cooling, or remove heat from, the transistors of the inverter, allowing high power operation without overheating by the inverter until the reservoir is depleted.

Figure 5:
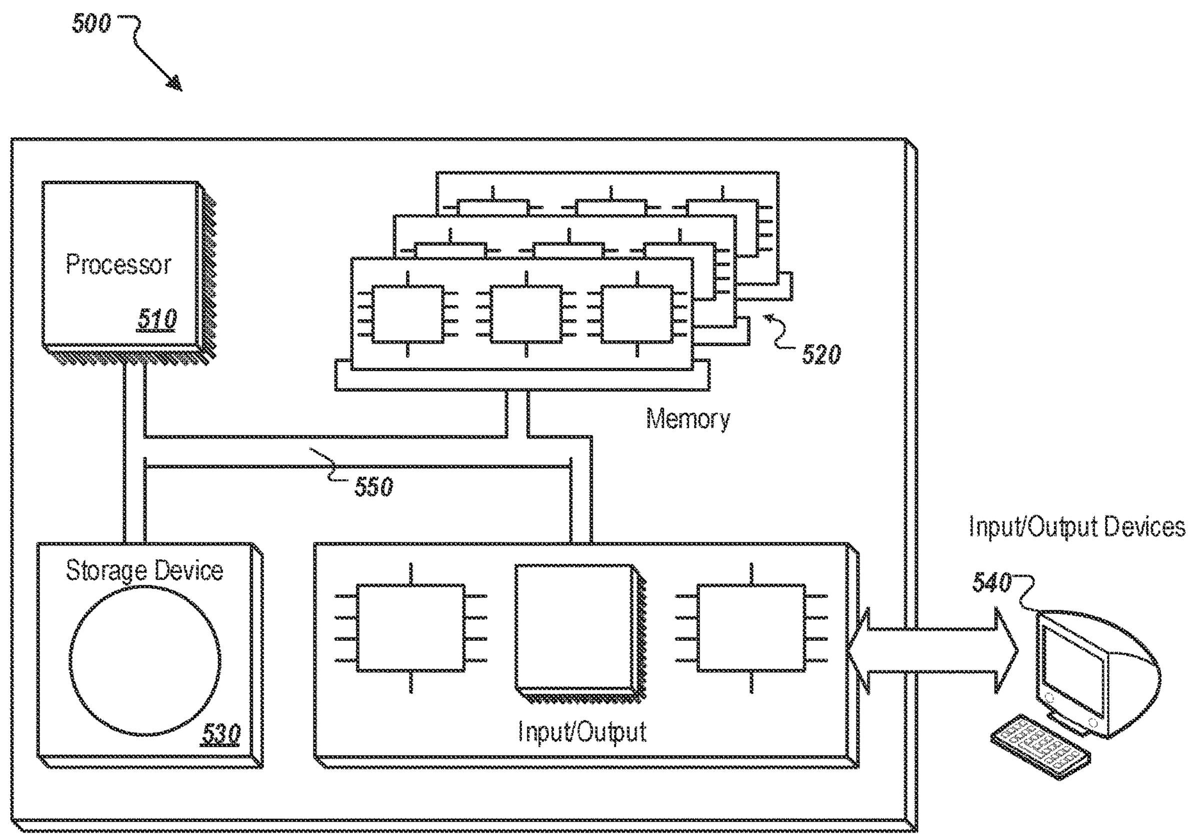
FIG. 5 is a schematic diagram of a computer system.

FIG. 5 is a schematic diagram of a computer system 500. The system 500 can be used to carry out the operations described in association with any of the computer-implemented methods described previously, according to some implementations. In some implementations, computing systems and devices and the functional operations described in this specification can be implemented in digital electronic circuitry, in tangibly-embodied computer software or firmware, in computer hardware, including the structures disclosed in this specification and their structural equivalents, or in combinations of one or more of them. The system 500 is intended to include various forms of digital computers, such as laptops, desktops, workstations, servers, blade servers, mainframes, and other appropriate computers. The system 500 can also include mobile devices, such as personal digital assistants, cellular telephones, smartphones, and other similar computing devices. Additionally, the system can include portable storage media, such as Universal Serial Bus (USB) flash drives. For example, the USB flash drives may store operating systems and other applications. The USB flash drives can include input/output components, such as a wireless transducer or USB connector that may be inserted into a USB port of another computing device.

The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system, including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits). The machine learning model can run on Graphic Processing Units (GPUs) or custom machine learning inference accelerator hardware.

To provide for interaction with a user, the features can be implemented on a computer having a display device such as a CRT (cathode ray tube) or LCD (liquid crystal display) monitor for displaying information to the user and a keyboard and a pointing device, such as a mouse or a trackball by which the user can provide input to the computer. Additionally, such activities can be implemented via touchscreen flat-panel displays and other appropriate mechanisms.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

The computer system can include clients and servers. A client and server are generally remote from each other and typically interact through a network, such as the described one. The relationship of client and server arises by virtue of computer programs running on the respective computers and having a client-server relationship to each other.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can, in some cases, be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The foregoing description is provided in the context of one or more particular implementations. Various modifications, alterations, and permutations of the disclosed implementations can be made without departing from scope of the disclosure. Thus, the present disclosure is not intended to be limited only to the described or illustrated implementations, but is to be accorded the widest scope consistent with the principles and features disclosed herein.

In other words, although this disclosure has been described in terms of certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure.

What is claimed is:

1. A method comprising:

identifying an overdraw condition at an output of an inverter, the inverter comprising a plurality of transistors;

toggling a switch to connect a transformer to the output of the inverter, the transformer configured to, when connected, step down voltage from the inverter to a circuit; and sensing, via a sensing line, a temperature associated with at least one transistor of the plurality of transistors, and in response to determining that the sensed temperature is greater than a first predetermined value while the transformer is connected:

deforming a diaphragm to open a control valve, the control valve arranged to release a compressed gas through an outlet channel in fluid communication with the at least one transistor of the plurality of transistors.

2. The method of claim 1, wherein the compressed gas is at least one of: air, carbon dioxide, nitrogen, or argon.

3. The method of claim 1, wherein opening the control valve comprises throttling flow through the outlet channel based on the sensed temperature associated with the at least one transistor.

4. The method of claim 1, further comprising:

sensing the temperature associated with the at least one transistor is below a second predetermined value; and shutting the control valve.

5. The method of claim 1, wherein the outlet channel is embedded within a heatsink, and wherein the heatsink is configured to perform passive cooling during normal operations.

6. The method of claim 1, wherein the transformer is an autotransformer.

7. A system comprising:

an inverter comprising a plurality of transistors;

a switch configured to connect a transformer to the output of the inverter, and when connected, step down voltage from the inverter to a circuit, the switch configured to toggle when an overdraw condition is identified at an output of the inverter; and a sensing line configured to sense a temperature associated with at least one transistor of the plurality of transistors, and in response to determining that the sensed temperature is greater than a first predetermined value while the transformer is connected:

cause a diaphragm to open a control valve, the control valve arranged to release a compressed gas through an outlet channel in fluid communication with the at least one transistor of the plurality of transistors.

8. The system of claim 7, wherein the compressed gas is at least one of: air, carbon dioxide, nitrogen, or argon.

9. The system of claim 7, wherein opening the control valve comprises throttling flow through the outlet channel based on the sensed temperature associated with the at least one transistor.

10. The system of claim 7, the sensing line further configured to:

sense the temperature associated with the at least one transistor is below a second predetermined value; and shut the control valve.

11. The system of claim 7, wherein the outlet channel is embedded within a heatsink, and wherein the heatsink is configured to perform passive cooling during normal operations.

12. The system of claim 7, wherein the transformer is an autotransformer.

13. An inverter comprising:

a plurality of transistors;

a switch configured to connect a transformer to the output of the inverter, and when connected, step down voltage from the inverter to a circuit, the switch configured to toggle when an overdraw condition is identified at an output of the inverter; and a sensing line configured to sense a temperature associated with at least one transistor of the plurality of transistors, and in response to determining that the sensed temperature is greater than a first predetermined value while the transformer is connected:

cause a diaphragm to open a control valve, the control valve arranged to release a compressed gas through an outlet channel in fluid communication with the at least one transistor of the plurality of transistors.

14. The inverter of claim 13, wherein the compressed gas is at least one of: air, carbon dioxide, nitrogen, or argon.

15. The inverter of claim 13, wherein opening the control valve comprises throttling flow through the outlet channel based on the sensed temperature associated with the at least one transistor.

16. The inverter of claim 13, the sensing line further configured to:

sense the temperature associated with the at least one transistor is below a second predetermined value; and shut the control valve.

17. The inverter of claim 13, wherein the outlet channel is embedded within a heatsink, and wherein the heatsink is configured to perform passive cooling during normal operations.

18. The inverter of claim 13, wherein the transformer is an autotransformer.

* * * * *